US011018638B2

(12) United States Patent
Khlat et al.

(10) Patent No.: US 11,018,638 B2
(45) Date of Patent: May 25, 2021

(54) MULTIMODE ENVELOPE TRACKING CIRCUIT AND RELATED APPARATUS

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 23 days.

(21) Appl. No.: 16/284,023

(22) Filed: Feb. 25, 2019

(65) Prior Publication Data
US 2020/0136575 A1    Apr. 30, 2020

Related U.S. Application Data

(60) Provisional application No. 62/753,499, filed on Oct. 31, 2018.

(51) Int. Cl.
*H03F 3/217*    (2006.01)
*H03F 1/02*     (2006.01)
(Continued)

(52) U.S. Cl.
CPC ............ *H03F 3/2178* (2013.01); *H03F 1/02* (2013.01); *H03F 3/19* (2013.01); *H03F 3/211* (2013.01);
(Continued)

(58) Field of Classification Search
CPC . H03F 3/2178; H03F 1/02; H03F 3/19; H03F 3/211; H03F 2200/421;
(Continued)

(56) References Cited

U.S. PATENT DOCUMENTS 5,838,732 A    11/1998 Carney
6,107,862 A    8/2000 Mukainakano et al.
(Continued)

FOREIGN PATENT DOCUMENTS

EP    3174199 A2    5/2017

OTHER PUBLICATIONS

Non-Final Office Action for U.S. Appl. No. 14/836,634, dated May 16, 2016, 9 pages.
(Continued)

*Primary Examiner* — Hieu P Nguyen
(74) *Attorney, Agent, or Firm* — Withrow & Terranova, P.L.L.C.

(57) ABSTRACT

A multimode envelope tracking (ET) circuit and related apparatus is provided. The multimode ET circuit is configured to provide an ET voltage(s) to an amplifier circuit(s) for amplifying a radio frequency (RF) signal(s) that may correspond to a wider range of modulation bandwidth. In this regard, the multimode ET circuit is configured to switch dynamically and opportunistically between different operation modes based on the modulation bandwidth of the RF signal(s). In examples discussed herein, the multimode ET circuit is configured to support a single amplifier circuit in a high-modulation-bandwidth mode and an additional amplifier circuit(s) in a mid-modulation-bandwidth mode and a low-modulation-bandwidth mode. By switching dynamically and opportunistically between different operation modes, it may be possible to reduce undesired series resonance that may cause distortion in the ET voltage(s), thus helping to improve efficiency and performance of the amplifier circuit(s) supported by the multimode ET circuit.

18 Claims, 4 Drawing Sheets

(51) Int. Cl.
*H03F 3/19* (2006.01)
*H03F 3/21* (2006.01)

(52) U.S. Cl.
CPC .. *H03F 2200/102* (2013.01); *H03F 2200/336* (2013.01); *H03F 2200/421* (2013.01)

(58) Field of Classification Search
CPC ......... H03F 2200/102; H03F 2200/336; H03F 2200/451; H03F 2200/516; H03F 3/68; H03F 1/0222
USPC ............... 330/136, 297, 127, 134, 279, 295; 33/124 R
See application file for complete search history.

(56) References Cited

U.S. PATENT DOCUMENTS

| | | | |
|---|---|---|---|
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 8,461,928 B2 | 6/2013 | Yahav et al. | |
| 8,493,141 B2 | 7/2013 | Khlat et al. | |
| 8,718,188 B2 | 5/2014 | Balteanu et al. | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2* | 5/2019 | Kim | H03F 1/02 |
| 10,382,071 B2 | 8/2019 | Rozek et al. | |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0155836 A1 | 6/2015 | Midya et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0126900 A1 | 5/2016 | Shute | |
| 2016/0173031 A1 | 6/2016 | Langer | |
| 2016/0181995 A1 | 6/2016 | Nentwig et al. | |
| 2016/0187627 A1 | 6/2016 | Abe | |
| 2016/0197627 A1 | 7/2016 | Qin et al. | |
| 2016/0226448 A1 | 8/2016 | Wimpenny | |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0317913 A1 | 11/2017 | Kim et al. | |
| 2017/0338773 A1 | 11/2017 | Balteanu et al. | |
| 2018/0048265 A1 | 2/2018 | Nentwig | |
| 2018/0048276 A1 | 2/2018 | Khlat et al. | |
| 2018/0076772 A1 | 3/2018 | Khesbak et al. | |
| 2018/0123453 A1 | 5/2018 | Puggelli et al. | |
| 2018/0288697 A1 | 10/2018 | Camuffo et al. | |
| 2018/0302042 A1 | 10/2018 | Zhang et al. | |
| 2018/0309414 A1 | 10/2018 | Khlat et al. | |
| 2018/0367101 A1 | 12/2018 | Chen et al. | |
| 2019/0068234 A1 | 2/2019 | Khlat et al. | |

(56) References Cited

U.S. PATENT DOCUMENTS

| | | |
|---|---|---|
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0238095 A1 | 8/2019 | Khlat |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0106392 A1 | 4/2020 | Khlat et al. |
| 2020/0136561 A1 | 4/2020 | Khlat et al. |
| 2020/0136563 A1 | 4/2020 | Khlat |
| 2020/0144966 A1 | 5/2020 | Khlat |
| 2020/0153394 A1 | 5/2020 | Khlat et al. |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, mailed Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Notice of Allowance for U.S. Appl. No. 16/246,859, dated Sep. 18, 2020, 8 pages.
Quayle Action for U.S. Appl. No. 16/421,905, mailed Aug. 25, 2020, 5 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, mailed Dec. 4, 2020, 8 pages.
Notice of Allowance for U.S. Appl. No. 16/122,611, dated Jan. 13, 2021, 8 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.

* cited by examiner

MULTIMODE ENVELOPE TRACKING CIRCUIT AND RELATED APPARATUS

RELATED APPLICATIONS

This application claims the benefit of provisional patent application Ser. No. 62/753,499, filed Oct. 31, 2018, the disclosure of which is hereby incorporated herein by reference in its entirety.

FIELD OF THE DISCLOSURE

The technology of the disclosure relates generally to envelope tracking (ET) circuits operating at a wide range of modulation bandwidth.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Advanced wireless communication technologies, such as long-term evolution (LTE) and fifth-generation new radio (5G-NR), are widely regarded as the foundations for future wireless communication systems. Typically, an RF communications signal(s) communicated in an LTE/5G-NR network(s) is modulated with a wider bandwidth (e.g., greater than 20 MHz). Concurrent to supporting the LTE/5G-NR communication technologies, the mobile communication devices may need to be backward compatible with legacy communication technologies, such as global system for mobile communications (GSM) and code-division multiple-access (CDMA). In contrast to the RF signals communicated in the LTE/5G-NR network(s), RF signals communicated in a legacy network(s) are often modulated at a narrower bandwidth (e.g., less than 5 MHz).

The mobile communication devices often employ a power amplifier(s) to increase output power of the RF signals (e.g., maintaining sufficient energy per bit) prior to communicating in the LTE/5G-NR or the legacy network. Envelope tracking is a power management technology designed to improve efficiency levels of power amplifiers to help reduce power consumption and thermal dissipation in the mobile communication devices. Given that the mobile communication devices can communicate in both the LTE/5G-NR and the legacy networks, it may be desired to configure an envelope tracking system to operate across a wider range of bandwidth without compromising efficiency and performance of the power amplifier(s).

SUMMARY

Embodiments of the disclosure relate to a multimode envelope tracking (ET) circuit and related apparatus. The multimode ET circuit is configured to provide an ET voltage(s) to an amplifier circuit(s) for amplifying a radio frequency (RF) signal(s) that may correspond to a wider range of modulation bandwidth. In this regard, the multimode ET circuit is configured to switch dynamically and opportunistically between different operation modes based on the modulation bandwidth of the RF signal(s). In examples discussed herein, the multimode ET circuit is configured to support a single amplifier circuit in a high-modulation-bandwidth mode and an additional amplifier circuit(s) in a mid-modulation-bandwidth mode and a low-modulation-bandwidth mode. By switching dynamically and opportunistically between different operation modes, it may be possible to reduce undesired series resonance that may cause distortion in the ET voltage(s), thus helping to improve efficiency and performance of the amplifier circuit(s) supported by the multimode ET circuit.

In one aspect, a multimode ET circuit is provided. The multimode ET circuit includes a first port configured to be coupled to a first amplifier circuit. The multimode ET circuit also includes a second port configured to be coupled to a second amplifier circuit. The multimode ET circuit also includes a first tracker circuit having a first tracker output coupled to the first port. The multimode ET circuit also includes a second tracker circuit having a second tracker output coupled to the second port. The multimode ET circuit also includes a switch circuit coupled to the first tracker output and the second tracker output. The multimode ET circuit also includes a control circuit. The control circuit is configured to control the switch circuit to couple the first tracker output with the second tracker output in response to determining that only a selected amplifier circuit among the first amplifier circuit and the second amplifier circuit is activated.

In another aspect, an ET amplifier apparatus is provided. The ET amplifier apparatus includes a first amplifier circuit. The ET amplifier apparatus also includes a second amplifier circuit. The ET amplifier apparatus also includes a multimode ET circuit. The multimode ET circuit includes a first port configured to be coupled to a first amplifier circuit. The multimode ET circuit also includes a second port configured to be coupled to a second amplifier circuit. The multimode ET circuit also includes a first tracker circuit having a first tracker output coupled to the first port. The multimode ET circuit also includes a second tracker circuit having a second tracker output coupled to the second port. The multimode ET circuit also includes a switch circuit coupled to the first tracker output and the second tracker output. The multimode ET circuit also includes a control circuit. The control circuit is configured to control the switch circuit to couple the first tracker output with the second tracker output in response to determining that only a selected amplifier circuit among the first amplifier circuit and the second amplifier circuit is activate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
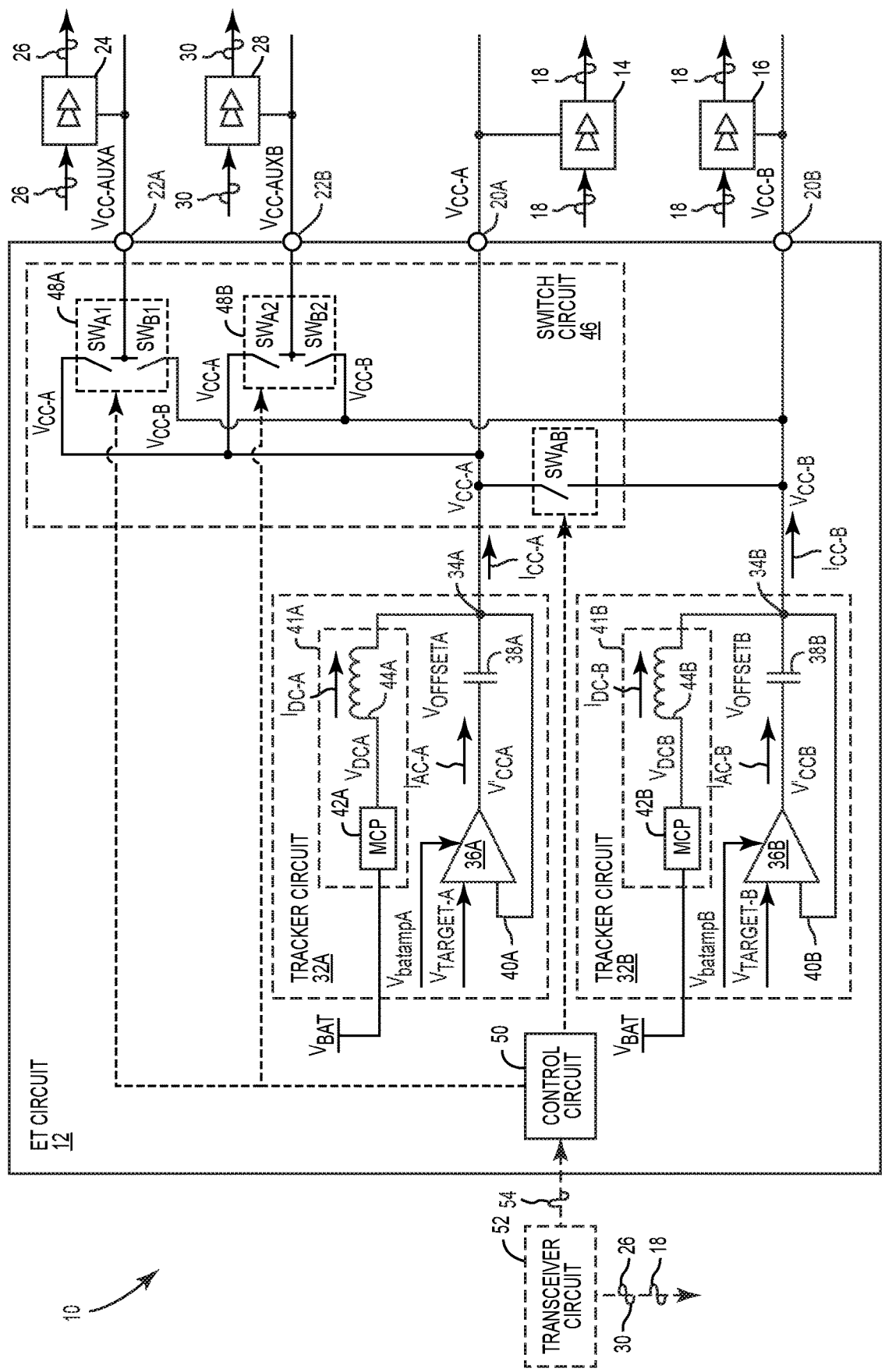
FIG. 1 is a schematic diagram of an exemplary envelope tracking (ET) amplifier apparatus that includes a multimode ET circuit configured to switch dynamically and opportunistically between a high-modulation-bandwidth mode, a mid-modulation-bandwidth mode, and a low-modulation-bandwidth mode.
Figure 3:
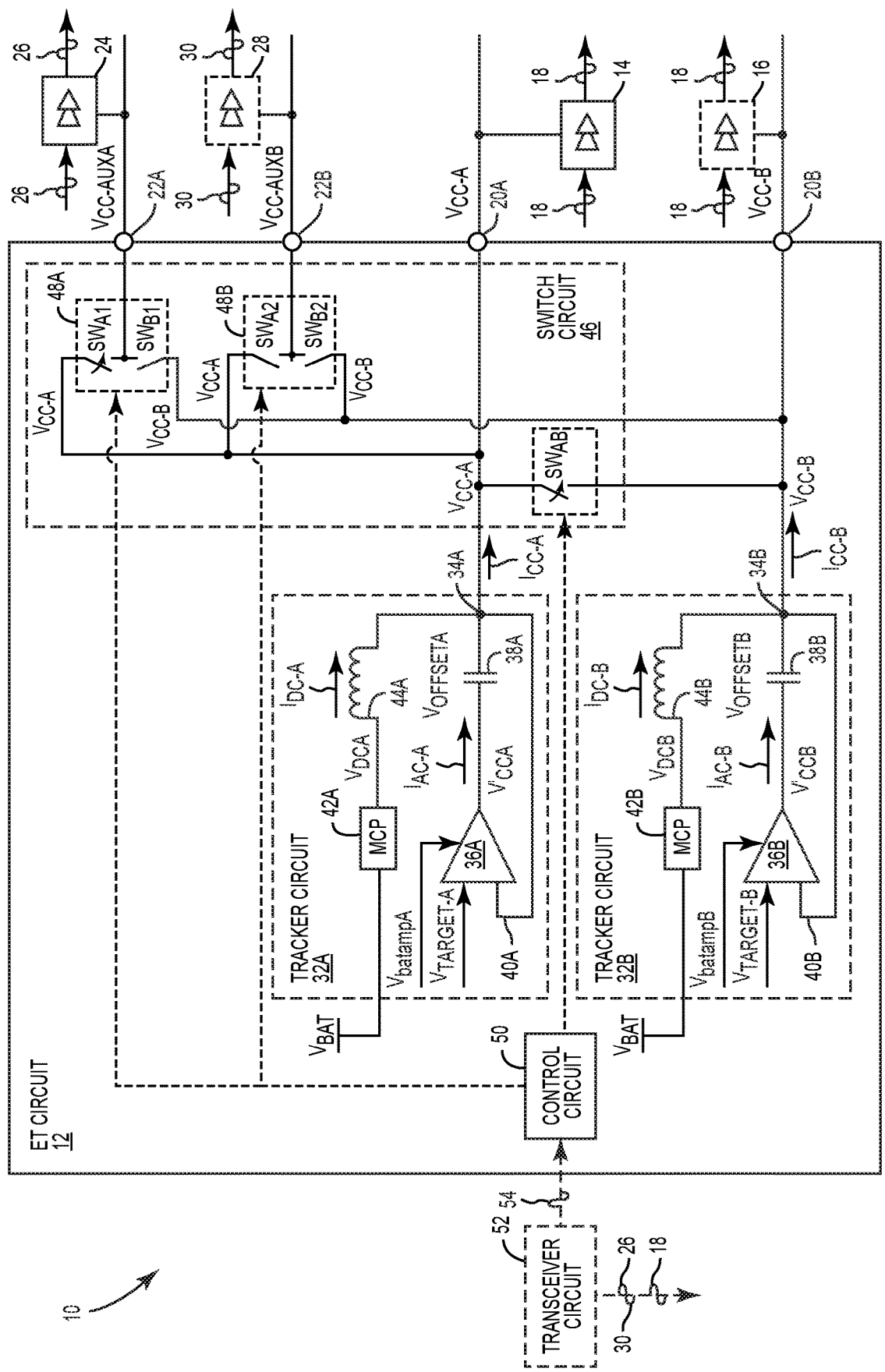
Figure 4:
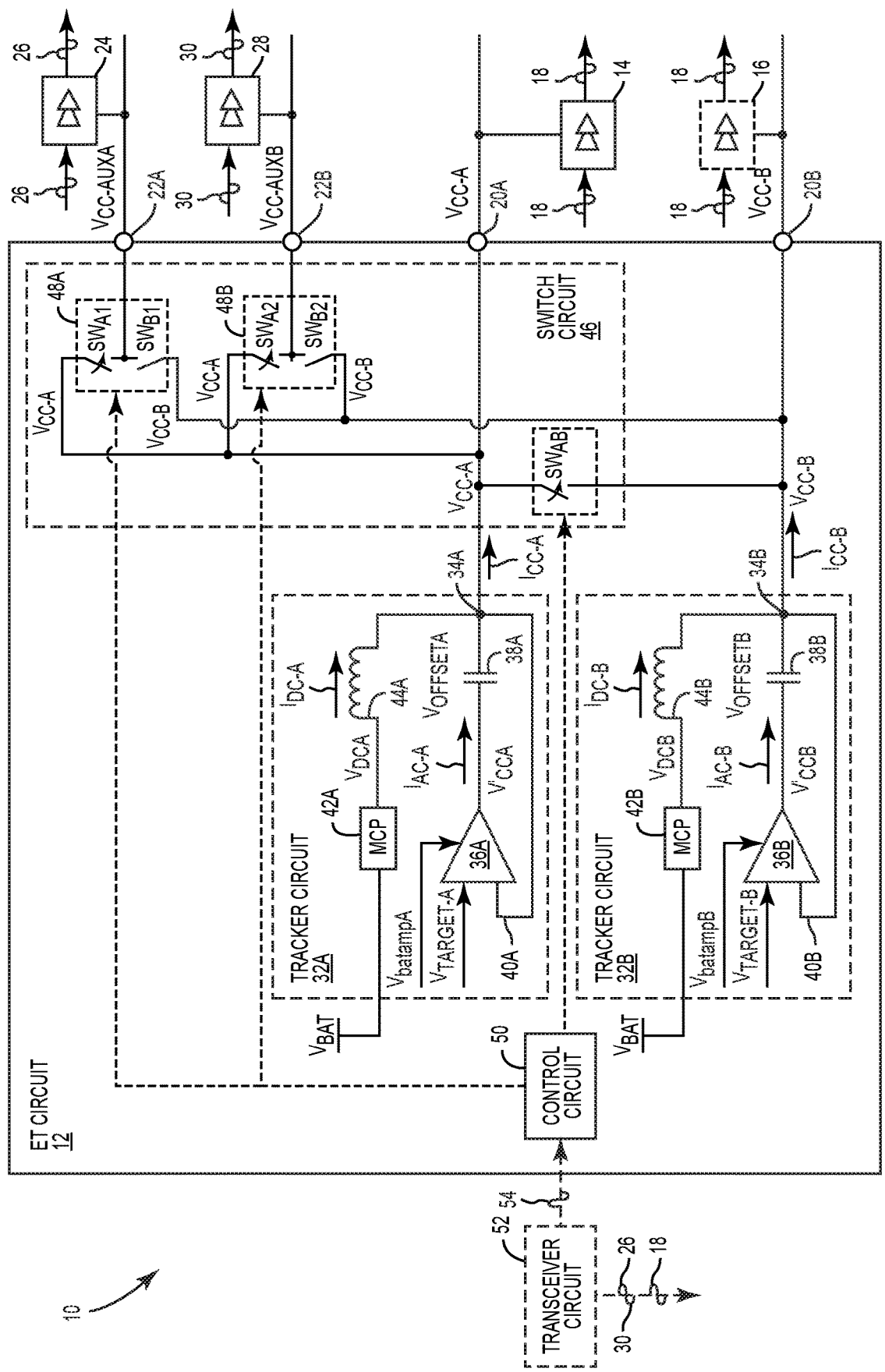

FIG. 3 is a schematic diagram providing an exemplary illustration of the ET amplifier apparatus of FIG. 1 in which the multimode ET circuit is configured to operate in the mid-modulation-bandwidth mode; and FIG. 4 is a schematic diagram providing an exemplary illustration of the ET amplifier apparatus of FIG. 1 in which the multimode ET circuit is configured to operate in the low-modulation-bandwidth mode.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multimode envelope tracking (ET) circuit and related apparatus. The multimode ET circuit is configured to provide an ET voltage(s) to an amplifier circuit(s) for amplifying a radio frequency (RF) signal(s) that may correspond to a wider range of modulation bandwidth. In this regard, the multimode ET circuit is configured to switch dynamically and opportunistically between different operation modes based on the modulation bandwidth of the RF signal(s). In examples discussed herein, the multimode ET circuit is configured to support a single amplifier circuit in a high-modulation-bandwidth mode and an additional amplifier circuit(s) in a mid-modulation-bandwidth mode and a low-modulation-bandwidth mode. By switching dynamically and opportunistically between different operation modes, it may be possible to reduce undesired series resonance that may cause distortion in the ET voltage(s), thus helping to improve efficiency and performance of the amplifier circuit(s) supported by the multimode ET circuit.

In this regard, FIG. 1 is a schematic diagram of an exemplary ET amplifier apparatus 10 that includes a multimode ET circuit 12 configured to switch dynamically and opportunistically between a high-modulation-bandwidth mode, a mid-modulation-bandwidth mode, and a low-modulation-bandwidth mode. The ET amplifier apparatus 10 includes a first amplifier circuit 14 and second amplifier circuit 16 that can be coupled to the multimode ET circuit 12. Each of the first amplifier circuit 14 and the second amplifier circuit 16 is capable of amplifying an RF signal 18 in a wide range of modulation bandwidth. In this regard, the first amplifier circuit 14 and the second amplifier circuit 16 may be referred to as "wide-bandwidth" amplifier circuits configured to support such advanced broadband communication technologies as long-term evolution (LTE), fifth-generation (5G), 5G new-radio (5G-NR), and so on. In a non-limiting example, the first amplifier circuit 14 and second amplifier circuit 16 are so configured to have a lower inherent load impedance.

In examples discussed herein, the RF signal 18 corresponds to a high-modulation bandwidth that is higher than 20 MHz (>20 MHz), or a mid-modulation bandwidth in between 5 MHz and 20 MHz (>5 MHz and 20 MHz), or a low modulation bandwidth that is lower than 5 MHz (<5 MHz). The multimode ET circuit 12 can be configured to operate in a high-modulation-bandwidth mode when the RF signal 18 corresponds to the high-modulation bandwidth, or in a mid-modulation-bandwidth mode when the RF signal 18 corresponds to the mid-modulation bandwidth, or in a low-modulation-bandwidth mode when the RF signal 18 corresponds to the low-modulation bandwidth.

The first amplifier circuit 14 and the second amplifier circuit 16 may both be activated to amplify the RF signal 18 for concurrent transmission in such application scenarios as uplink carrier aggregation (ULCA), multiple-input multiple-output (MIMO), or beamforming. However, in certain application scenarios, such as single-input single-output (SISO), only one of the first amplifier circuit 14 and the second amplifier circuit 16 is activated for amplifying the RF signal 18 (hereinafter referred to as a "single activation scenario"). In this regard, the multimode ET circuit 12 may be configured to take advantage of the single activation scenario to switch dynamically and opportunistically between the different operation modes based on the modulation bandwidth of the RF signal 18. As such, the multimode ET circuit 12 may help improve efficiency and performance of the first amplifier circuit 14 and/or the second amplifier circuit 16, particularly in the single activation scenario.

The multimode ET circuit 12 includes a first port 20A and a second port 20B configured to be coupled to the first amplifier circuit 14 and the second amplifier circuit 16, respectively. The multimode ET circuit 12 may also include a first auxiliary port 22A and a second auxiliary port 22B. The first auxiliary port 22A may be coupled to a first auxiliary amplifier circuit 24 for amplifying a first auxiliary RF signal 26. The second auxiliary port 22B may be coupled to a second auxiliary amplifier circuit 28 for amplifying a second auxiliary RF signal 30.

In examples discussed herein, the first auxiliary RF signal 26 and the second auxiliary RF signal 30 both correspond to the low modulation bandwidth (<5 MHz). In this regard, the first auxiliary amplifier circuit 24 and the second auxiliary amplifier circuit 28 may be referred to as "narrow-bandwidth" amplifier circuits configured to support such legacy communication technologies as global system for mobile communications (GSM), code-division multiple-access (CDMA), and so on. In a non-limiting example, the first auxiliary amplifier circuit 24 and the second auxiliary amplifier circuit 28 are so configured to have a higher inherent load impedance than the first amplifier circuit 14 and the second amplifier circuit 16.

The multimode ET circuit 12 includes a first tracker circuit 32A and a second tracker circuit 32B. The first tracker circuit 32A is configured to generate a first ET voltage $V_{CC\text{-}A}$ and a first current $I_{CC\text{-}A}$ at a first tracker output 34A. The second tracker circuit 32B is configured to generate a second ET voltage $V_{CC\text{-}B}$ and a second current $I_{CC\text{-}B}$ at a second tracker output 34B.

The first tracker circuit 32A includes a first voltage amplifier 36A, which is configured to generate a first initial ET voltage $V'_{CCA}$ based on a first ET target voltage $V_{TARGET\text{-}A}$ and a first supply voltage $V_{batampA}$. The first tracker circuit 32A includes a first offset capacitor 38A coupled between the first voltage amplifier 36A and the first tracker output 34A. The first offset capacitor 38A is configured to rise the first initial ET voltage $V'_{CCA}$ by a first offset voltage $V_{OFFSETA}$ (e.g., 0.8 V) to generate the first ET voltage $V_{CC\text{-}A}$ at the first tracker output 34A. The first tracker circuit 32A may include a first feedback loop 40A, which is configured to indicate a differential between the first ET voltage $V_{CC\text{-}A}$ and the first initial ET voltage $V'_{CCA}$.

The second tracker circuit 32B includes a second voltage amplifier 36B, which is configured to generate a second initial ET voltage $V'_{CCB}$ based on a second ET target voltage $V_{TARGET\text{-}B}$ and a second supply voltage $V_{batampB}$. The second tracker circuit 32B includes a second offset capacitor 38B coupled between the second voltage amplifier 36B and the second tracker output 34B. The second offset capacitor 38B is configured to raise the second initial ET voltage $V'_{CCB}$ by a second offset voltage $V_{OFFSETB}$ (e.g., 0.8 V) to generate the second ET voltage $V_{CC\text{-}B}$ at the second tracker output 34B. The second tracker circuit 32B may include a second feedback loop 40B, which is configured to indicate a differential between the second ET voltage $V_{CC\text{-}B}$ and the second initial ET voltage $V'_{CCB}$.

The first current $I_{CC\text{-}A}$ may include a first low-frequency current $I_{DC\text{-}A}$ (e.g., a direct current) and a first high-frequency current $I_{AC\text{-}A}$ (e.g., an alternating current). In this regard, the first tracker circuit 32A can include a first multilevel charge pump (MCP) circuit 41A configured to generate the first low-frequency current $I_{DC\text{-}A}$. More specifically, the first MCP circuit 41A includes a first multilevel charge pump (MCP) 42A that is configured to generate a first constant voltage $V_{DCA}$ based on a battery voltage $V_{BAT}$. The first MCP circuit 41A can also include a first inductor 44A coupled between the first MCP 42A and the first tracker output 34A. The first inductor 44A is configured to induce the first low-frequency current $I_{DC\text{-}A}$ based on the first constant voltage $V_{DCA}$. The first voltage amplifier 36A may be configured to generate the first high-frequency current $I_{AC\text{-}A}$. The first voltage amplifier 36A may generate the first high-frequency current $I_{AC\text{-}A}$ in response to the differential between the first ET voltage $V_{CC\text{-}A}$ and the first initial ET voltage $V'_{CCA}$ as received via the first feedback loop 40A.

The second current $I_{CC\text{-}B}$ may include a second low-frequency current $I_{DC\text{-}B}$ (e.g., a direct current) and a second high-frequency current $I_{AC\text{-}B}$ (e.g., an alternating current). In this regard, the first tracker circuit 32A can include a second MCP circuit 41B configured to generate the second low-frequency current $I_{DC\text{-}B}$. More specifically, the second MCP circuit 41B can include a second MCP 42B that is configured to generate a second constant voltage $V_{DCB}$ based on the battery voltage $V_{BAT}$. The second MCP circuit 41B can also include a second inductor 44B coupled between the second MCP 42B and the second tracker output 34B. The second inductor 44B is configured to induce the second low-frequency current $I_{DC\text{-}B}$ based on the second constant voltage $V_{DCB}$. The second voltage amplifier 36B may be configured to generate the second high-frequency current $I_{AC\text{-}B}$. The second voltage amplifier 36B may generate the second high-frequency current $I_{AC\text{-}B}$ in response to the differential between the second ET voltage $V_{CC\text{-}B}$ and the second initial ET voltage $V'_{CCB}$ as received via the second feedback loop 40B.

The multimode ET circuit 12 includes a switch circuit 46. On one end, the switch circuit 46 is coupled to the first tracker output 34A and the second tracker output 34B. On the other end, the switch circuit 46 is coupled to the first port 20A, the second port 20B, the first auxiliary port 22A, and the second auxiliary port 22B. In a non-limiting example, the switch circuit 46 includes a primary switch $SW_{AB}$ that is coupled between the first tracker output 34A and the second tracker output 34B. The switch circuit 46 may also include first switch circuitry 48A and second switch circuitry 48B. The first switch circuitry 48A includes switches $SW_{A1}$ and $SW_{A2}$ configured to couple the first tracker output 34A and/or the second tracker output 34B to the first auxiliary port 22A, or to decouple the first tracker output 34A and/or the second tracker output 34B from the first auxiliary port 22A. The second switch circuitry 48B includes switches $SW_{B1}$ and $SW_{B2}$ configured to couple the first tracker output 34A and/or the second tracker output 34B to the second auxiliary port 22B, or to decouple the first tracker output 34A and/or the second tracker output 34B from the second auxiliary port 22B.

The multimode ET circuit 12 can include a control circuit 50, which can be a microprocessor, a microcontroller, or a field-programmable gate array (FPGA) for example. The control circuit 50 may be coupled to the primary switch $SW_{AB}$, the first switch circuitry 48A, and the second switch circuitry 48B. In a non-limiting example, the control circuit 20 can be coupled to a transceiver circuit 52 configured to provide an indication signal 54 to the control circuit 50. The indication signal 54 may indicate the different operation modes (e.g., high-modulation-bandwidth mode, mid-modulation-bandwidth mode, or low-modulation-bandwidth mode) for the multimode ET circuit 12. Accordingly, the control circuit 50 may control the switch circuit 46 to selectively couple the first tracker output 34A and/or the second tracker output 34B to the first port 20A, the second port 20B, the first auxiliary port 22A, and/or the second auxiliary port 22B in the different operation modes.

Specific discussion of the multimode ET circuit 12 configured to operate in the high-modulation-bandwidth mode, the mid-modulation-bandwidth mode, and the low-modulation-bandwidth mode is provided below with reference to FIGS. 2-4, respectively. Common elements between FIGS. 1-4 are shown therein with common element numbers and will not be re-described herein.

Figure 2:
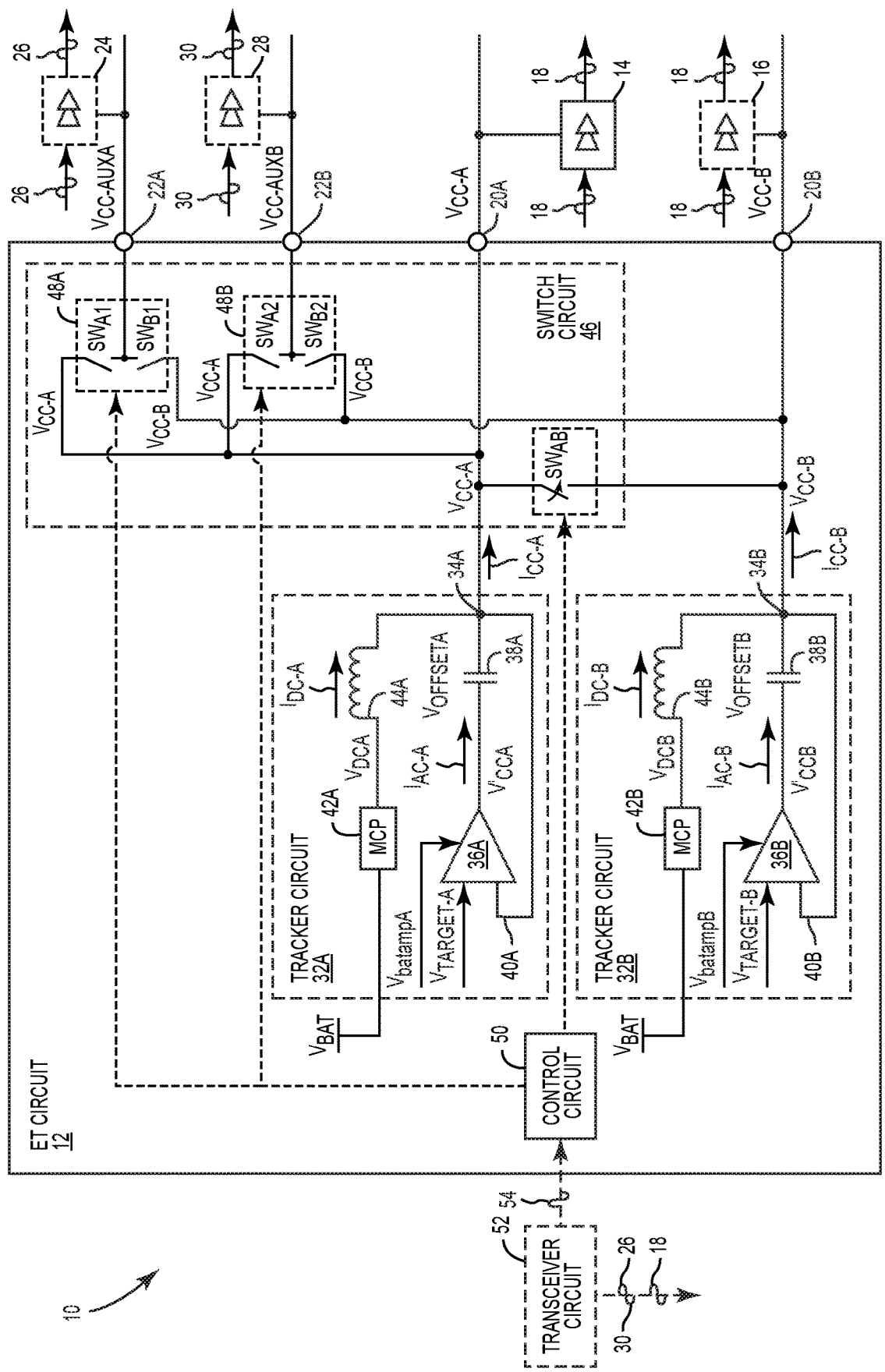
FIG. 2 is a schematic diagram providing an exemplary illustration of the ET amplifier apparatus of FIG. 1 in which the multimode ET circuit is configured to operate in the high-modulation-bandwidth mode.

FIG. 2 is a schematic diagram providing an exemplary illustration of the ET amplifier apparatus 10 of FIG. 1 in which the multimode ET circuit 12 is configured to operate in the high-modulation-bandwidth mode. In a non-limiting example, the control circuit 50 can configure the multimode ET circuit 12 to operate in the high-modulation-bandwidth mode based on the indication signal 54 received from the transceiver circuit 52.

When the multimode ET circuit 12 operates in the high-modulation-bandwidth mode, only a selected amplifier circuit among the first amplifier circuit 14 and the second amplifier circuit 16 is activated. In examples discussed herein, the first amplifier circuit 14 is activated as the selected amplifier circuit. It should be appreciated that the second amplifier circuit 16 may be activated as the selected amplifier circuit as well. In a non-limiting example, the RF signal 18 communicated via the selected amplifier circuit can be a 5G or a 5G-NR communication signal.

In the high-modulation-bandwidth mode, the control circuit 50 may be configured to close the primary switch $SW_{AB}$ to couple the first tracker output 34A with the second tracker output 34B. The control circuit 50 may also be configured to activate the first voltage amplifier 36A to provide the first ET voltage $V_{CC-A}$ to the selected amplifier circuit, while deactivating the second voltage amplifier 36B. The control circuit 50 may be further configured to activate both the first MCP 42A and the second MCP 42B to provide the first low-frequency current $I_{DC-A}$ and the second low-frequency current $I_{DC-B}$ to the selected amplifier circuit via a selected port (e.g., the first port 20A) among the first port 20A and the second port 20B. The control circuit 50 may activate a selected voltage amplifier (e.g., the first voltage amplifier 36A) among the first voltage amplifier 36A and the second voltage amplifier 36B to provide a selected ET voltage (e.g., the first ET voltage $V_{CC-A}$) to a selected tracker output (e.g., the first tracker output 34A) and thus to the selected amplifier circuit. In this regard, the selected amplifier circuit (e.g., the first amplifier circuit 14) receives the first ET voltage $V_{CC-A}$ from the first tracker circuit 32A and the first current $I_{CC-A}$ from both the first tracker circuit 32A and the second tracker circuit 32B. More specifically, the first current $I_{CC-A}$ includes the first high-frequency current $I_{AC-A}$, the first low-frequency current $I_{DC-A}$, and the second low-frequency current $I_{DC-B}$ ($I_{CC-A}=I_{AC-A}+I_{DC-A}+I_{DC-B}$). In a non-limiting example, the first low-frequency current $I_{DC-A}$ is substantially equal to the second low-frequency current $I_{DC-B}$ ($I_{DC-A}=I_{DC-B}\pm0.1$ mA).

Concurrent to activating the selected amplifier circuit among the first amplifier circuit 14 and the second amplifier circuit 16, the control circuit 50 deactivates the first auxiliary amplifier circuit 24 and the second auxiliary amplifier circuit 28. Accordingly, the control circuit 50 may open the switches $SW_{A1}$, $SW_{B2}$, $SW_{A2}$, and $SW_{B2}$ to decouple the first auxiliary port 22A and the second auxiliary port 22B from the first tracker output 34A and the second tracker output 34B. In a non-limiting example, the control circuit 50 can close the primary switch $SW_{AB}$ concurrently to opening the switches $SW_{A1}$, $SW_{B1}$, $SW_{A2}$, and $SW_{B2}$. As such, the first auxiliary amplifier circuit 24 and the second auxiliary amplifier circuit 28 are isolated from the first tracker output 34A and the second tracker output 34B. As such, it may be possible to prevent additional capacitance being added to the first tracker circuit 32A and the second tracker circuit 32B. In addition, it may also be possible to prevent series resonance resulted from trace inductance from interfering with the first ET voltage $V_{CC-A}$ and/or the second ET voltage $V_{CC-B}$. As a result, it may be possible to reduce distortions in the first ET voltage $V_{CC-A}$ and/or the second ET voltage $V_{CC-B}$, thus helping to improve efficiency and/or linearity of the first amplifier circuit 14 and/or the second amplifier circuit 16.

FIG. 3 is a schematic diagram providing an exemplary illustration of the ET amplifier apparatus 10 of FIG. 1 in which the multimode ET circuit 12 is configured to operate in the mid-modulation-bandwidth mode. In a non-limiting example, the control circuit 50 can configure the multimode ET circuit 12 to operate in the mid-modulation-bandwidth mode based on the indication signal 54 received from the transceiver circuit 52.

When the multimode ET circuit 12 operates in the mid-modulation-bandwidth mode, only the selected amplifier circuit (e.g., the first amplifier circuit 14) among the first amplifier circuit 14 and the second amplifier circuit 16 is activated. In a non-limiting example, the control circuit 50 activates the first voltage amplifier 36A to provide the first ET voltage $V_{CC-A}$ to the selected amplifier circuit via the first port 20A, while deactivating the second voltage amplifier 36B. The control circuit 50 also activates the first MCP 42A and the second MCP 42B to provide the first low-frequency current $I_{DC-A}$ and the second low-frequency current $I_{DC-B}$ to the selected amplifier circuit via the first port 20A.

The control circuit 50 may activate a selected auxiliary amplifier circuit (e.g., the first auxiliary amplifier circuit 24) among the first auxiliary amplifier circuit 24 and the second auxiliary amplifier circuit 28. In a non-limiting example, the control circuit 50 can activate the selected auxiliary amplifier circuit as being one having a lower inherent capacitance among the first auxiliary amplifier circuit 24 and the second auxiliary amplifier circuit 28. Concurrent to activating the selected auxiliary amplifier circuit, the control circuit 50 may close the switch $SW_{A1}$ to couple the first tracker output 34A to a selected auxiliary port (e.g., the first auxiliary port 22A) among the first auxiliary port 22A and the second auxiliary port 22B such that the first tracker circuit 32A can provide the first ET voltage $V_{CC-A}$ to the selected auxiliary amplifier circuit. Concurrent to closing the primary switch $SW_{AB}$ and the switch $SW_{A1}$, the control circuit 50 opens the switches $SW_{B1}$, $SW_{A2}$, and $SW_{B2}$. In a non-limiting example, the RF signal 18 communicated via the selected amplifier circuit (e.g., the first amplifier circuit 14) can be an LTE communication signal and the first auxiliary RF signal 26 communicated via the selected auxiliary amplifier circuit (e.g., the first auxiliary amplifier circuit 24) can be a legacy communication signal.

FIG. 4 is a schematic diagram providing an exemplary illustration of the ET amplifier apparatus 10 of FIG. 1 in which the multimode ET circuit 12 is configured to operate in the low-modulation-bandwidth mode. In a non-limiting example, the control circuit 50 can configure the multimode ET circuit 12 to operate in the low-modulation-bandwidth mode based on the indication signal 54 received from the transceiver circuit 52.

When the multimode ET circuit 12 operates in the low-modulation-bandwidth mode, only the selected amplifier circuit (e.g., the first amplifier circuit 14) among the first amplifier circuit 14 and the second amplifier circuit 16 is activated. In a non-limiting example, the control circuit 50 activates the first voltage amplifier 36A to provide the first ET voltage $V_{CC-A}$ to the selected amplifier circuit via the first port 20A, while deactivating the second voltage amplifier 36B. The control circuit 50 also activates the first MCP 42A and the second MCP 42B to provide the first low-frequency current $I_{DC-A}$ and the second low-frequency current $I_{DC-B}$ to the selected amplifier circuit via the first port 20A.

The control circuit 50 may activate both the first auxiliary amplifier circuit 24 and the second auxiliary amplifier circuit 28. Upon activating the first auxiliary amplifier circuit 24 and the second auxiliary amplifier circuit 28, the control circuit 50 may close the switch $SW_{A1}$ and $SW_{A2}$ to couple the first tracker output 34A to the first auxiliary port 22A and the second auxiliary port 22B such that the first tracker circuit 32A can provide the first ET voltage $V_{CC-A}$ to the first auxiliary amplifier circuit 24 and the second auxiliary amplifier circuit 28. Concurrent to closing the primary switch $SW_{AB}$ and the switches $SW_{A1}$ and $SW_{A2}$, the control circuit 50 opens the switches $SW_{B1}$ and $SW_{B2}$. In a non-limiting example, the RF signal 18, the first auxiliary RF signal 26, and the second auxiliary RF signal 30 can all be legacy communication signals.

Those skilled in the art will recognize improvements and modifications to the preferred embodiments of the present disclosure. All such improvements and modifications are considered within the scope of the concepts disclosed herein and the claims that follow.

What is claimed is:

1. A multimode envelope tracking (ET) circuit comprising:
    a first port configured to be coupled to a first amplifier circuit;
    a second port configured to be coupled to a second amplifier circuit;
    a first tracker circuit having a first tracker output coupled to the first port;
    a second tracker circuit having a second tracker output coupled to the second port;
    a switch circuit comprising a primary switch coupled to the first tracker output and the second tracker output; and
    a control circuit configured to close the primary switch to couple the first tracker output with the second tracker output in response to determining that only a selected amplifier circuit among the first amplifier circuit and the second amplifier circuit is activated.

2. The multimode ET circuit of claim 1 wherein:
    the first tracker circuit comprises:
        a first voltage amplifier coupled to the first tracker output and configured to generate a first ET voltage at the first tracker output; and
        a first multi-level charge pump (MCP) circuit coupled to the first tracker output and configured to generate a first low-frequency current at the first tracker output; and
    the second tracker circuit comprises:
        a second voltage amplifier coupled to the second tracker output and configured to generate a second ET voltage at the second tracker output; and
        a second MCP circuit coupled to the second tracker output and configured to generate a second low-frequency current at the second tracker output.

3. The multimode ET circuit of claim 2 further comprising a first auxiliary port and a second auxiliary port configured to be coupled to a first auxiliary amplifier circuit and a second auxiliary amplifier circuit, respectively, wherein the switch circuit further comprises:
    first switch circuitry coupled to the first tracker output, the second tracker output, and the first auxiliary port; and
    second switch circuitry coupled to the first tracker output, the second tracker output, and the second auxiliary port.

4. The multimode ET circuit of claim 3 wherein the control circuit is further configured to:
    activate the first MCP circuit and the second MCP circuit to provide the first low-frequency current and the second low-frequency current to the first tracker output and the second tracker output, respectively; and
    activate a selected voltage amplifier among the first voltage amplifier and the second voltage amplifier to provide a selected ET voltage among the first ET voltage and the second ET voltage to a selected tracker output coupled to the selected voltage amplifier.

5. The multimode ET circuit of claim 4 wherein the control circuit is further configured to:
    determine that the multimode ET circuit is configured to operate in a high-modulation-bandwidth mode;
    close the primary switch to couple the first tracker output with the second tracker output; and
    control the first switch circuitry and the second switch circuitry to decouple the first auxiliary port and the second auxiliary port from the first tracker output and the second tracker output.

6. The multimode ET circuit of claim 4 wherein the control circuit is further configured to:
    determine that the multimode ET circuit is configured to operate in a mid-modulation-bandwidth mode;
    close the primary switch to couple the first tracker output with the second tracker output; and
    control the first switch circuitry and the second switch circuitry to couple a selected auxiliary port among the first auxiliary port and the second auxiliary port to the selected tracker output.

7. The multimode ET circuit of claim 4 wherein the control circuit is further configured to:
    determine that the multimode ET circuit is configured to operate in a low-modulation-bandwidth mode;
    close the primary switch to couple the first tracker output with the second tracker output; and
    control the first switch circuitry and the second switch circuitry to couple the first auxiliary port and the second auxiliary port to the selected tracker output.

8. The multimode ET circuit of claim 1 further comprising a first auxiliary port and a second auxiliary port configured to be coupled to a first auxiliary amplifier circuit and a second auxiliary amplifier circuit, respectively, wherein:
the first tracker circuit comprises:
a first voltage amplifier coupled to the first tracker output and configured to generate a first ET voltage at the first tracker output; and
a first multi-level charge pump (MCP) circuit coupled to the first tracker output and configured to generate a first low-frequency current at the first tracker output;
the second tracker circuit comprises:
a second voltage amplifier coupled to the second tracker output and configured to generate a second ET voltage at the second tracker output; and
a second MCP circuit coupled to the second tracker output and configured to generate a second low-frequency current at the second tracker output; and
the switch circuit comprises:
a primary switch coupled between the first tracker output and the second tracker output;
first switch circuitry coupled to the first tracker output, the second tracker output, and the first auxiliary port; and
second switch circuitry coupled to the first tracker output, the second tracker output, and the second auxiliary port.

9. An envelope tracking (ET) amplifier apparatus comprising:
a first amplifier circuit;
a second amplifier circuit; and
a multimode ET circuit comprising:
a first port coupled to the first amplifier circuit;
a second port coupled to the second amplifier circuit;
a first tracker circuit having a first tracker output coupled to the first port;
a second tracker circuit having a second tracker output coupled to the second port;
a switch circuit comprising a primary switch coupled to the first tracker output and the second tracker output; and
a control circuit configured to close the primary switch to couple the first tracker output with the second tracker output in response to determining that only a selected amplifier circuit among the first amplifier circuit and the second amplifier circuit is activated.

10. The ET amplifier apparatus of claim 9 wherein:
the first tracker circuit comprises:
a first voltage amplifier coupled to the first tracker output and configured to generate a first ET voltage at the first tracker output; and
a first multi-level charge pump (MCP) circuit coupled to the first tracker output and configured to generate a first low-frequency current at the first tracker output; and
the second tracker circuit comprises:
a second voltage amplifier coupled to the second tracker output and configured to generate a second ET voltage at the second tracker output; and
a second MCP circuit coupled to the second tracker output and configured to generate a second low-frequency current at the second tracker output.

11. The ET amplifier apparatus of claim 10 wherein:
the first MCP circuit comprises:
a first MCP configured to generate a first constant voltage based on a battery voltage; and
a first inductor configured to induce the first low-frequency current based on the first constant voltage; and
the second MCP circuit comprises:
a second MCP configured to generate a second constant voltage based on the battery voltage; and
a second inductor configured to induce the second low-frequency current based on the second constant voltage.

12. The ET amplifier apparatus of claim 10 wherein:
the first tracker circuit further comprises a first offset capacitor coupled between the first voltage amplifier and the first tracker output; and
the second tracker circuit further comprises a second offset capacitor coupled between the second voltage amplifier and the second tracker output.

13. The ET amplifier apparatus of claim 10 further comprising a first auxiliary amplifier circuit and a second auxiliary amplifier circuit, wherein:
the multimode ET circuit further comprises a first auxiliary port and a second auxiliary port coupled to the first auxiliary amplifier circuit and the second auxiliary amplifier circuit, respectively; and
the switch circuit further comprises:
first switch circuitry coupled to the first tracker output, the second tracker output, and the first auxiliary port; and
second switch circuitry coupled to the first tracker output, the second tracker output, and the second auxiliary port.

14. The ET amplifier apparatus of claim 13 wherein the control circuit is further configured to:
activate the first MCP circuit and the second MCP circuit to provide the first low-frequency current and the second low-frequency current to the first tracker output and the second tracker output, respectively; and
activate a selected voltage amplifier among the first voltage amplifier and the second voltage amplifier to provide a selected ET voltage among the first ET voltage and the second ET voltage to a selected tracker output coupled to the selected voltage amplifier.

15. The ET amplifier apparatus of claim 14 wherein the control circuit is further configured to:
determine that the multimode ET circuit is configured to operate in a high-modulation-bandwidth mode in response to receiving an indication signal from a transceiver circuit coupled to the ET amplifier apparatus;
close the primary switch to couple the first tracker output with the second tracker output; and
control the first switch circuitry and the second switch circuitry to decouple the first auxiliary port and the second auxiliary port from the first tracker output and the second tracker output.

16. The ET amplifier apparatus of claim 14 wherein the control circuit is further configured to:
determine that the multimode ET circuit is configured to operate in a mid-modulation-bandwidth mode in response to receiving an indication signal from a transceiver circuit coupled to the ET amplifier apparatus;
close the primary switch to couple the first tracker output with the second tracker output; and
control the first switch circuitry and the second switch circuitry to couple a selected auxiliary port among the first auxiliary port and the second auxiliary port to the selected tracker output.

17. The ET amplifier apparatus of claim 14 wherein the control circuit is further configured to:

determine that the multimode ET circuit is configured to operate in a low-modulation-bandwidth mode in response to receiving an indication signal from a transceiver circuit coupled to the ET amplifier apparatus;
close the primary switch to couple the first tracker output with the second tracker output; and
control the first switch circuitry and the second switch circuitry to couple the first auxiliary port and the second auxiliary port to the selected tracker output.

18. The ET amplifier apparatus of claim 9 further comprising a first auxiliary amplifier circuit and a second auxiliary amplifier circuit, wherein:
the multimode ET circuit further comprises a first auxiliary port and a second auxiliary port coupled to the first auxiliary amplifier circuit and the second auxiliary amplifier circuit, respectively;
the first tracker circuit comprises:
a first voltage amplifier coupled to the first tracker output and configured to generate a first ET voltage at the first tracker output; and
a first multi-level charge pump (MCP) circuit coupled to the first tracker output and configured to generate a first low-frequency current at the first tracker output;
the second tracker circuit comprises:
a second voltage amplifier coupled to the second tracker output and configured to generate a second ET voltage at the second tracker output; and
a second MCP circuit coupled to the second tracker output and configured to generate a second low-frequency current at the second tracker output; and
the switch circuit comprises:
a primary switch coupled between the first tracker output and the second tracker output;
first switch circuitry coupled to the first tracker output, the second tracker output, and the first auxiliary port; and
second switch circuitry coupled to the first tracker output, the second tracker output, and the second auxiliary port.

* * * * *

UNITED STATES PATENT AND TRADEMARK OFFICE
CERTIFICATE OF CORRECTION

Page 1 of 1

PATENT NO. : 11,018,638 B2
APPLICATION NO. : 16/284023
DATED : May 25, 2021
INVENTOR(S) : Nadim Khlat and Michael R. Kay It is certified that error appears in the above-identified patent and that said Letters Patent is hereby corrected as shown below:

In the Specification

Column 4, Line 59, replace "(>5 MHz and 20 MHz)" with --(>5 MHz and ≤20 MHz)--.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*